United States Patent
Muray et al.

(10) Patent No.: US 6,693,735 B1
(45) Date of Patent: Feb. 17, 2004

(54) MEMS STRUCTURE WITH SURFACE POTENTIAL CONTROL

(75) Inventors: Lawrence P. Muray, Moraga, CA (US); Bryan P. Staker, Pleasanton, CA (US); Andres Fernandez, Dublin, CA (US)

(73) Assignee: Glimmerglass Networks, Inc., Hayward, CA (US)

( * ) Notice: Subject to any disclaimer, the term of this patent is extended or adjusted under 35 U.S.C. 154(b) by 164 days.

(21) Appl. No.: 09/919,219

(22) Filed: Jul. 30, 2001

(51) Int. Cl.[7] .......................... G02B 26/00; G02B 26/08
(52) U.S. Cl. ........................................ 359/291; 359/224
(58) Field of Search ................................ 359/291, 295, 359/292, 293, 290, 224, 214

(56) References Cited

U.S. PATENT DOCUMENTS

| | | | |
|---|---|---|---|
| 5,396,364 A | * | 3/1995 | O'Meara et al. ............ 359/292 |
| 5,991,066 A | * | 11/1999 | Robinson et al. ........... 359/293 |
| 6,034,810 A | * | 3/2000 | Robinson et al. ........... 359/293 |
| 6,291,266 B1 | * | 9/2001 | Sayyah ....................... 438/107 |
| 6,449,406 B1 | * | 9/2002 | Fan et al. ..................... 385/17 |
| 2002/0101769 | | 8/2002 | Garverick et al. |

* cited by examiner

Primary Examiner—Hung Xuan Dang
Assistant Examiner—Joseph Martinez
(74) Attorney, Agent, or Firm—Townsend and Townsend and Crew LLP; Kenneth R. Allen

(57) ABSTRACT

In an electrostatically controlled apparatus, such as a MEMS array having cavities formed around electrodes and which is mounted directly on a dielectric substrate in which are embedded electrostatic actuation electrodes disposed in alignment with the individual MEMS elements, a mechanism is provided to controllably neutralize excess charge and establish a controlled potential between the MEMS elements and the electrostatic actuation electrodes.

12 Claims, 2 Drawing Sheets

MEMS STRUCTURE WITH SURFACE POTENTIAL CONTROL

CROSS-REFERENCES TO RELATED APPLICATIONS

NOT APPLICABLE

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK.

NOT APPLICABLE

BACKGROUND OF THE INVENTION

This invention relates to electro ceramic components and structures that accurately control surface potentials around electro ceramic components. Components constructed according to the invention can be Micro Electro Mechanical System (MEMS) devices, MEMS arrays, or other micromachined elements.

Conventional MEMS array structures comprise Silicon on Insulator (SOI) array structures associated with an electrode array disposed to interact with the MEMS actuatable elements. Electrostatic MEMS structures develop forces and torques between the actuatable elements and their corresponding electrodes. Conventional MEMS structures separate conductive surfaces with dielectrics. These dielectrics contribute to the mechanical operation of the device because accumulated charge distributions on their surfaces contribute to the electrostatic force and/or torque on the MEMS actuatable elements. One of the problems encountered is control of the surface potentials between the electrodes and control of the surface potentials on the insulators. Surface potentials on dielectric surfaces are prone to drift due to charge migration along dielectric surfaces between said electrodes. An issue that arises is that the potential of these surfaces is not controlled due to non-linear conduction across the surfaces of ions and charges that accumulate in an uncontrolled fashion. The conduction characteristics of these surfaces are inherently unstable due to sensitivity to temperature, moisture and other environmental factors. They can also be affected by electromagnetic radiation (light), which can be time dependent depending on the application, contributing to a system crosstalk. The conductivity of these surfaces is also strongly affected by impurities and process steps and materials used in the deposition and etching of the surfaces. All of these factors combined contribute to a loss of control of the surface potentials that contribute to the forces and torques applied to the actuatable elements resulting in an unreliable and uncontrollable device.

What is needed is a solution that allows for control of the dielectric surface potentials so that the electrostatic forces and torques are determined solely by the voltages applied to the electrodes.

SUMMARY OF THE INVENTION

According to the invention, in an electrostatically controlled apparatus, such as a MEMS array having cavities formed around electrodes and which is mounted directly on a dielectric substrate in which are embedded electrostatic actuation electrodes disposed in alignment with the individual MEMS elements, a mechanism is provided to controllably neutralize excess charge and establish a controlled potential between the MEMS elements and the electrostatic actuation electrodes.

In a specific embodiment the substrate has at least a surface or volume of selected high resistivity material at least between the electrodes.

In a further specific embodiment, a highly conductive coating such as gold, palladium, platinum, titanium nitride or any similar non-oxidizing conductive material is also provided on the surface of the cavity confronting the electrodes, including on the back portion of the actuatable element facing the electrodes so that all surfaces that contribute to electrostatic forces and torques have controlled potentials.

In a specific embodiment, there is provided a deposition of a high-resistivity material such as chromium oxide or tin oxide everywhere over previously patterned electrodes. The charge on the dielectric surfaces on the substrate is thus controlled so that the surface potential between adjacent electrodes and between the electrodes and the actuatable element is determined by small but stable leakage currents between electrodes of different potentials. The leakage current is limited by material characteristics so that power dissipation levels and crosstalk between electrodes are mitigated, yet permitting enough current to flow to create stable, repeatable and temperature- and humidity-independent potential gradients along the surfaces to allow for highly accurate deflection of the MEMS actuatable elements. The MEMS support structure is then bonded to the substrate after a coating has been deposited.

In another embodiment, the entire dielectric substrate is allowed to be slightly conductive, that is, conductive with high resistivity. The surface potentials between electrodes are controlled without necessitating an additional deposition.

In another embodiment, trenches are etched in an insulating substrate between the electrodes at a depth to assure that the forces generated by the charges that accumulate on the surfaces of the dielectric are negligible. This, in some cases, is practical because the loss of force and torque is highly non-linear with distance and the charge on the side walls does not contribute to torque or displacement.

The invention will be better understood by reference to the following detailed description in connection with the accompanying illustrations.

DETAILED DESCRIPTION OF THE INVENTION

Figure 1:
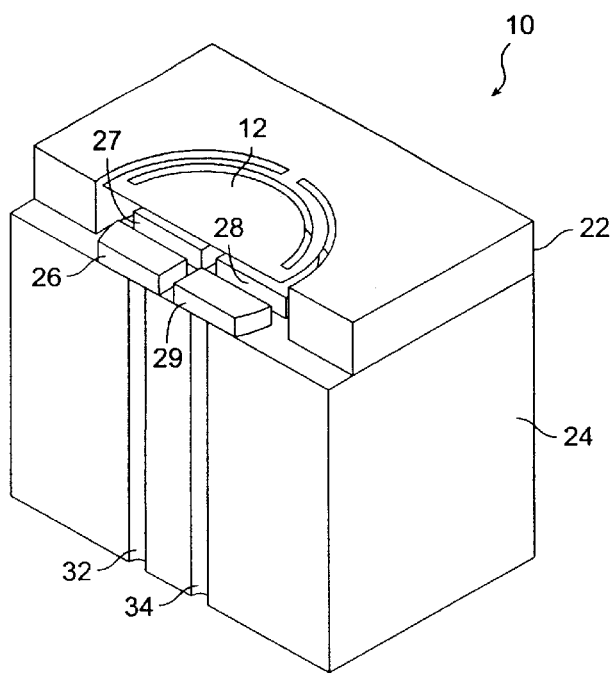
FIG. 1 is a perspective view in cutaway of a representative embodiment according to the invention.

Reference is made to FIG. 1 in which is shown a single MEMS array element 10 according to the invention, with a MEMS-based mirror 12 fabricated in an integrated Silicon on Insulator structure (MEMS structure) 22 and mounted on an electrically insulative (ceramic) substrate or base 24. According to the invention, a mechanism is provided whereby charge surrounding electrodes 26–29, which are connected to voltage sources (not shown) through vias 32, 34, etc., is neutralized relative to adjacent non-electrode regions, such as the insulative substrate structure 24. The structure of element 10 shown is not specific to a particular configuration. However, details of specific configurations are illustrated by FIGS. 2–6. The structure may be for example a silicon plate 22 mounted to a ceramic base 24, silicon plate 22 to polyimide materials base 24, silicon plate 22 to circuit board base 24, silicon plate 22 to silicon base 24, silicon plate 22 to thick film on any substrate material as the base 24, or silicon plate 22 to thin film on any substrate material as the base 24. The method of joining is not limited by this invention, as for example to techniques of bonding, gluing, welding, riveting or the like.

Electrodes 26–29 mounted directly on the substrate 24 are energized to actuate the mirror 12 through electrostatic force. Charges residing on dielectric surfaces associated with the actuation can create an undesired perturbation in the potential relative to the areas surrounding the electrodes. The invention mitigates the accumulation of charge by use of a charge drain structure or charge draining method of operation.

Figure 2:
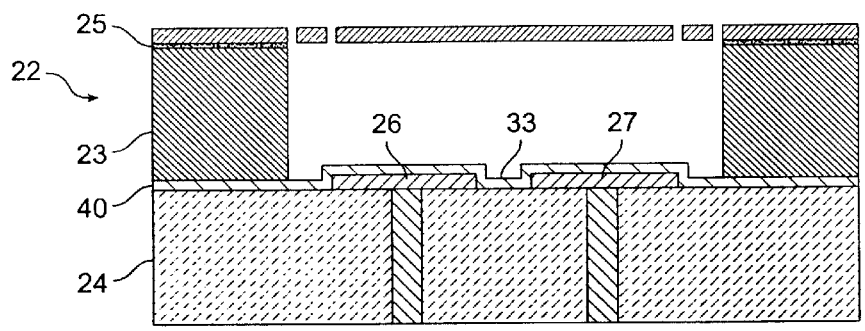
FIG. 2 is a side cross-sectional view of a single array element according to a first embodiment of the invention.

Referring to FIG. 2, there is shown one form of charge neutralization or drain structure in accordance with the invention. The substrate 24 is insulative ceramic, the plate 22 is conductive or semiconductive, such as a silicon block 23 on an insulative layer 25 (oxide), and a coating of highly resistive material 40 is disposed between the silicon block 23 and the ceramic base 24, extending across the surface of the base 24 and over the electrodes 26, 27, etc., including the regions 33 between the electrodes 26, 27. The resistive material is for example chromium oxide, tin oxide, indium tin oxide, carbon, titanium boride, chromium boride, molybdenum silicide, tungsten silicide or titanium nitride, all of which have an inherently high but finite resistivity. In a preferred embodiment, the bulk resistivity is in the range of about 100,000 to 10,000,000 ohm-cm, providing a surface resistivity of about 1,000,000,000 ohms per square (in a typical geometry and thickness). This characteristic is sufficient to neutralize charge relative to regions adjacent the electrodes, but not so low as to interfere with the operation of the electrodes in response to applied voltages.

Figure 3:
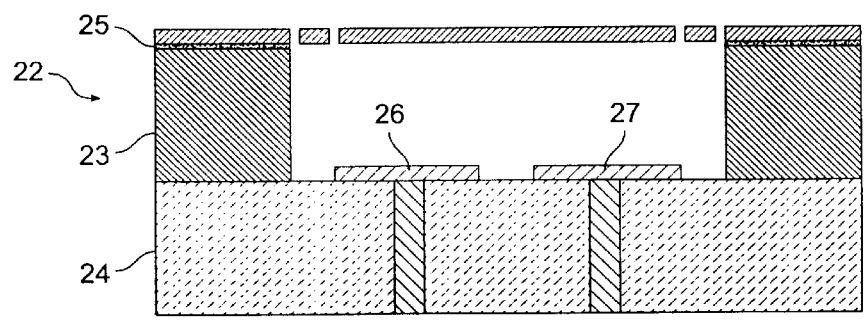
FIG. 3 is a side cross-sectional view of a single array element according to a second embodiment of the invention.

Referring to FIG. 3, there is shown a further form of charge neutralization or drain structure in accordance with the invention. The substrate 24 is modestly conductive or so-called resistive, rather than insulative, ceramic, and the plate 22 is conductive or semiconductive, such as a silicon block 23 on an insulative layer 25 (oxide). In this structural configuration, the ceramic base has a bulk resistivity of 10,000,000 to 1,000,000,000 ohm-cm in a typical geometry and thickness, providing a surface resistivity between electrodes 26, 27, etc., and relative to adjacent structures, such as walls of the cavity, of about 1,000,000,000 ohms per square. The resultant operational characteristic is within the intended range.

Figure 4:
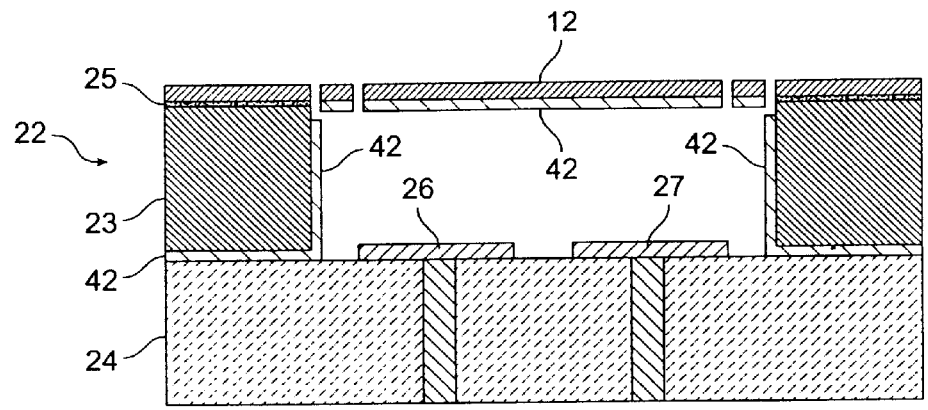
FIG. 4 is a side cross-sectional view of a single array element according to a third embodiment of the invention.

Referring to FIG. 4, there is shown a further form of charge neutralization or drain structure in accordance with the invention. The substrate 24 is insulative ceramic, and the plate 22 is conductive or semiconductive, such as a silicon block 23 on an insulative layer 25 (oxide). In this structure, a conductive layer 42 is disposed between the block 24 and the plate 22, extending over the inner surface of the cavity formed in the plate 22 and over the inner surface of the actuatable elements 12. The silicon 22 tends to oxidize, thereby reducing the surface conductivity of this semiconductive material. The layer 42 compensates for this potential loss of conductivity. It is therefore preferable that the layer be formed of highly conductive, non-oxidizing materials, such as gold, palladium, platinum and titanium nitride. This structure could be used in conjunction with the structure of FIG. 2 to provide a complete solution to charge neutralization. Similarly, this structure could be used with the structure of FIG. 5, hereinafter discussed.

Figure 5:
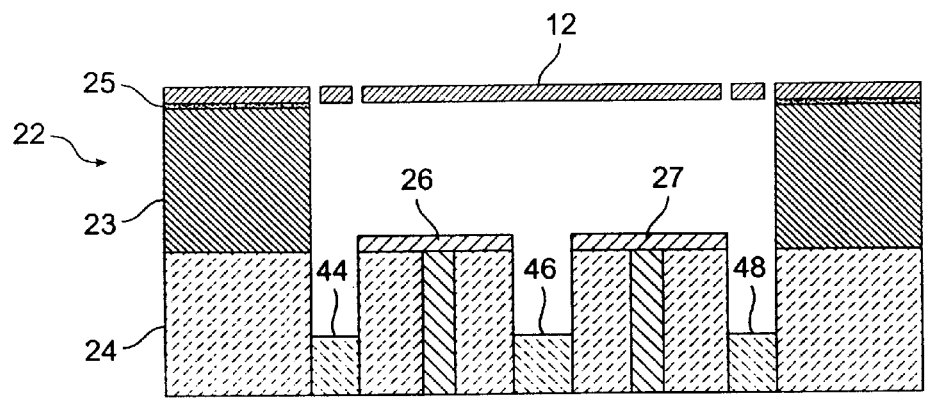
FIG. 5 is a side cross-sectional view of a single array element according to a fourth embodiment of the invention.

Referring to FIG. 5, there is shown a further form of charge neutralization or drain structure in accordance with the invention. The substrate 24 is insulative ceramic, and the plate 22 is conductive or semiconductive, such as a silicon block 23 on an insulative layer 25 (oxide). In this structure, electrodes 26, 27, etc. are spaced at a preselected distance from the actuatable element 12, while the regions 44, 46, 48 between the electrodes are distanced from both the edges of the faces of the electrodes and the surface of the actuatable element 12 so that they cannot interact in any substantial way with the fields between actuatable element 12 and the electrodes 26, 27. For this purpose, the regions 44, 46, 48 may be trenches having a depth of on the order of twice the separation between the actuatable element 12 and the electrodes 26, 27. The effective influence of those regions 44, 46, 48 decreases by at least the square of the separation from the actuatable element 12. Hence the forces generated by the charges that accumulate on the surfaces of the regions 44, 46, 48 are negligible.

The invention has been explained with reference to specific embodiments. Other embodiments will be evident to those of ordinary skill in the art. Therefore, it is not intended that this invention be limited, except as indicated by the appended claims.

What is claimed is:

1. An electrostatically controlled apparatus having cavities formed around electrodes and which is mounted on a substrate having electrostatic actuation electrodes disposed in alignment with the individual actuatable elements, comprising:

means in between the actuatable elements and the electrostatic actuation electrodes for establishing a controlled potential along all surfaces between the actuatable elements and the electrostatic actuation electrodes.

2. The apparatus according to claim 1 wherein at least a surface of selected high resistivity is provided at least between the electrodes for establishing a controlled surface potential between the electrodes without excessive leakage current.

3. The apparatus according to claim 1, wherein a coating of selected high resistivity is provided at least between the electrodes for establishing a controlled surface potential between the electrodes without excessive leakage current.

4. The apparatus according to claim 3, wherein a highly conductive coating is provided on the surface of each cavity confronting the electrodes, including on the back portion of the actuatable element facing the electrodes so that all surfaces that contribute to electrostatic forces and torques have controlled potentials.

5. The apparatus according to claim 4, wherein the highly conductive coating is selected from the group including gold, palladium, platinum and titanium nitride.

6. The apparatus according to claim 2, wherein a highly conductive coating is provided on the surface of each cavity confronting the electrodes, including on the back portion of the actuatable element facing the electrodes so that all surfaces that contribute to electrostatic forces and torques have controlled potentials.

7. The apparatus according to claim 6, wherein the highly conductive coating is selected from the group including gold, palladium, platinum and titanium nitride.

8. The apparatus according to claim 1, wherein a deposition of a high-resistivity material is provided everywhere over the electrodes.

9. The apparatus according to claim 8 wherein the deposition is selected from the group including chromium oxide, tin oxide, indium tin oxide, carbon, titanium boride, chromium boride, molybdenum silicide, tungsten silicide and titanium nitride.

10. The apparatus according to claim 1 wherein a dielectric substrate is slightly conductive with high resistivity so that surface potentials between electrodes are controlled without necessitating additional deposition.

11. An electrostatically controlled apparatus having cavities formed around electrodes and which is mounted on a substrate having electrostatic actuation electrodes disposed in alignment with the individual actuatable elements, comprising:

means for controllably draining excess charge and establishing a controlled potential among the actuatable elements and the electrostatic actuation electrodes wherein trenches are etched in an insulating substrate between the electrodes at a depth to assure that charges that accumulate on the surfaces of the dielectric are negligible.

12. The apparatus according to claim 1 wherein trenches are etched in an insulating substrate between the electrodes at a depth to assure that charges that accumulate on the surfaces of the dielectric are negligible.

* * * * *